United States Patent
Azarchs et al.

(10) Patent No.: US 9,639,090 B1
(45) Date of Patent: May 2, 2017

(54) SAFE TARGET POSITION COMPUTATION FOR HELIOSTATS NEAR A CONCENTRATING SOLAR POWER RECEIVER

(71) Applicant: eSolar, Inc., Burbank, CA (US)

(72) Inventors: Adam Azarchs, Paris (FR); Alexander Sonn, Pasadena, CA (US)

( * ) Notice: Subject to any disclaimer, the term of this patent is extended or adjusted under 35 U.S.C. 154(b) by 564 days.

(21) Appl. No.: 14/139,664

(22) Filed: Dec. 23, 2013

Related U.S. Application Data

(60) Provisional application No. 61/745,473, filed on Dec. 21, 2012.

(51) Int. Cl.
*G05D 3/10* (2006.01)

(52) U.S. Cl.
CPC .................................. *G05D 3/105* (2013.01)

(58) Field of Classification Search
CPC ..................................................... G05D 3/105
USPC ........................................................ 700/287
See application file for complete search history.

(56) References Cited

U.S. PATENT DOCUMENTS

| | | | | |
|---|---|---|---|---|
| 4,459,972 A * | 7/1984 | Moore | | F24J 2/10 126/600 |
| 4,536,847 A * | 8/1985 | Erickson | | F24J 2/38 126/575 |
| 5,851,309 A * | 12/1998 | Kousa | | F24J 2/0444 126/578 |
| 6,738,154 B1 * | 5/2004 | Venable | | G06K 9/32 358/1.15 |
| 8,104,893 B2 * | 1/2012 | Reznik | | F24J 2/07 126/573 |
| 9,103,719 B1 * | 8/2015 | Ho | | G01J 1/1626 |
| 2004/0231716 A1 * | 11/2004 | Litwin | | F24J 2/10 136/246 |
| 2009/0179139 A1 * | 7/2009 | Hines | | F24J 2/10 250/203.4 |
| 2009/0229264 A1 * | 9/2009 | Gilon | | F03G 6/001 60/641.8 |
| 2010/0139644 A1 * | 6/2010 | Schwarzbach | | F24J 2/07 126/573 |
| 2010/0191378 A1 * | 7/2010 | Gilon | | F24J 2/38 700/275 |
| 2011/0036343 A1 * | 2/2011 | Kroyzer | | F24J 2/07 126/574 |
| 2011/0155119 A1 * | 6/2011 | Hickerson | | F24J 2/38 126/574 |

(Continued)

OTHER PUBLICATIONS

Berenguel, et al., "An artificial vision-based control system . . ." (truncated), Solar Energy, vol. 76, 2004, pp. 563-575 (Berenguel, from https://www.researchgate.net/publication/222577886_An_artificial_visionbased_control_system_for_automatic_heliostat_positioning_offset_correction_in_a_central_receiver_solar_power_plant, accessed May 17, 2016).*

*Primary Examiner* — Kenneth M Lo
*Assistant Examiner* — Michael J Huntley
(74) *Attorney, Agent, or Firm* — Brooks Acordia IP Law, P.C.; Pajman Yedidsion

(57) ABSTRACT

Methods, systems, and devices for determining an unsafe region and a safe target in a central receiver solar power plant by projecting the geometry of the central receiver onto a plane image using a perspective transform as seen from the perspective of a heliostat, dilating the geometry of the central receiver in the plane image by a safety margin, and selecting a set of safe target points for the heliostat.

20 Claims, 9 Drawing Sheets

(56) References Cited

U.S. PATENT DOCUMENTS

| | | | | |
|---|---|---|---|---|
| 2012/0123720 A1* | 5/2012 | Fukuba | ............... | F24J 2/40 |
| | | | | 702/94 |
| 2012/0279485 A1* | 11/2012 | Koningstein | ............ | F24J 2/38 |
| | | | | 126/573 |
| 2013/0081668 A1* | 4/2013 | Linderman | ............ | F24J 2/38 |
| | | | | 136/246 |
| 2013/0206209 A1* | 8/2013 | Lasich | ............... | F24J 2/07 |
| | | | | 136/246 |
| 2014/0110560 A1* | 4/2014 | Hines | ............... | F24J 2/07 |
| | | | | 250/203.4 |
| 2014/0238387 A1* | 8/2014 | Kroyzer | ............ | F24J 2/07 |
| | | | | 126/714 |

\* cited by examiner

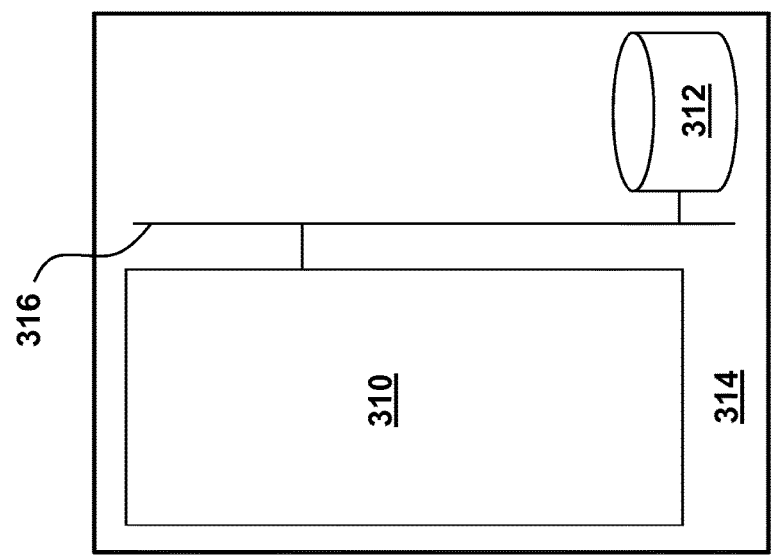

SAFE TARGET POSITION COMPUTATION FOR HELIOSTATS NEAR A CONCENTRATING SOLAR POWER RECEIVER

CROSS-REFERENCE TO RELATED APPLICATIONS

This application claims priority to and the benefit of Provisional Patent Application No. 61/745,473 filed Dec. 21, 2012, the contents of which are hereby incorporated by reference herein for all purposes.

FIELD OF ENDEAVOR

The invention in its several embodiments relates to the field of concentrating solar thermal power and more particularly, to methods, devices, and systems for positioning heliostats in a concentrating solar thermal power plant.

BACKGROUND

Concentrating solar thermal power plants utilize heliostats to reflect light onto a central receiver. Varying flux requirements for the central receiver often necessitate moving a greater, or fewer, number of heliostats to a position that allows them to direct light onto the central receiver. If heliostats are not directing light onto a central receiver then they may be directing light to some other position. An indiscriminate aiming strategy, for the heliostats not directing light at a central receiver, may cause damage to wildlife, e.g., birds, and/or plant equipment.

SUMMARY

Exemplary embodiments may include a method comprising: projecting the geometry of the central receiver onto a plane image using a perspective transform as seen from the perspective of a heliostat, where the plane is at a distance from the heliostat to mitigate errors due to shifts in the heliostat perspective origin; dilating the geometry of the central receiver in the plane image by a safety margin; and determining an unsafe region in a central receiver solar power plant based on the dilated safety margin. In additional exemplary method embodiments, the safety margin may be greater than the radius of the expected beam size from the heliostat. In additional exemplary method embodiments, an additional disallowed target region may be added to the safety margin, where the additional disallowed target region may account for the tolerances of the heliostat aiming accuracy. In additional exemplary method embodiments, the safety margin and the additional disallowed target region may change in shape over the course of a day due to at least one of: the position of the Sun, and changing constraints imposed by the range of motion of the heliostat. In additional exemplary method embodiments, a convex hull of the image may be used in place of a full set of information. In additional exemplary method embodiments, the additional disallowed target region may be expanded to include areas within which a non-tracking Sun heliostat aim point would drift into the safety margin over the course of the day. In additional exemplary method embodiments, the additional disallowed target region may be divided into convex polygons.

Other exemplary method embodiments may include a method of selecting a safe target point given an unsafe region, the method comprising: projecting a heliostat aim point onto a plane image with an unsafe region; selecting a direction of travel for the projected aim point; and selecting the safe target point by moving in the selected direction for the minimum distance required to exit the unsafe region. In additional exemplary method embodiments, the direction of travel selected may minimize the distance from the projected heliostat aim point to an edge of the unsafe region so long as the direction is not excluded. In additional exemplary method embodiments, a direction may be excluded if it goes over a restricted area, and the restricted area may be at least one of: an uncooled appurtenance of a central receiver and an associated equipment. In additional exemplary method embodiments, a direction may be excluded if the safe target point on the edge of the unsafe region may not be tracked by the heliostat at the current time without going beyond the range of motion of the heliostat. In additional exemplary method embodiments, one or more additional constraints may be used to pick a direction when the minimal distance from the projected heliostat aim point to an edge of the unsafe region is excluded. In additional exemplary method embodiments, the direction of travel selected may be based on a strategy to defocus the resulting flux of heliostats tracking their selected safe targets. In additional exemplary method embodiments, the strategy may involve the selection of directions by at least one of: a random selection, a quasi-random selection, and a round-robin selection.

Exemplary system embodiments may include a safe target selection system comprising: a control processing unit comprising a processor and addressable memory; the control processing unit configured to: project a heliostat aim point onto a plane image comprising at least one of: a central receiver, a tower, and associated equipment; determine an unsafe region around the at least one central receiver, tower, and associated equipment; and select a safe target point for the heliostat, wherein the safe target point is outside the unsafe region and meets one or more constraints. In additional exemplary system embodiments, the constraints may be that the safe target point delivers probabilistically no flux to the central receiver, the tower, and the associated equipment, and the safe target point is a minimal distance from the central receiver. In additional exemplary system embodiments, the constraints may be at least one of: the safe target point delivering probabilistically no flux to the central receiver, the tower, and the associated equipment; the safe target point is a minimal distance from the central receiver; the safe target point is within the tracking range of motion of the heliostat; the distance between the tracking point and the safe target does not exceed a set limit; the safe target point will not drift back into the unsafe region in the event of a power failure that prevents the heliostat from tracking the safe target point; the safe target point does not create an overly-high flux concentration when combined with the safe target points of other heliostats; and the safe target point does not necessitate moving the heliostat across an unsafe region.

BRIEF DESCRIPTION OF DRAWINGS

Embodiments are illustrated by way of example and not limitation in the figures of the accompanying drawings, in which:

FIG. 3 depicts an exemplary control processing unit for determining one or more alternate locations to reflect flux for heliostats that are not reflecting flux onto a central receiver;

DETAILED DESCRIPTION

Figure 1:
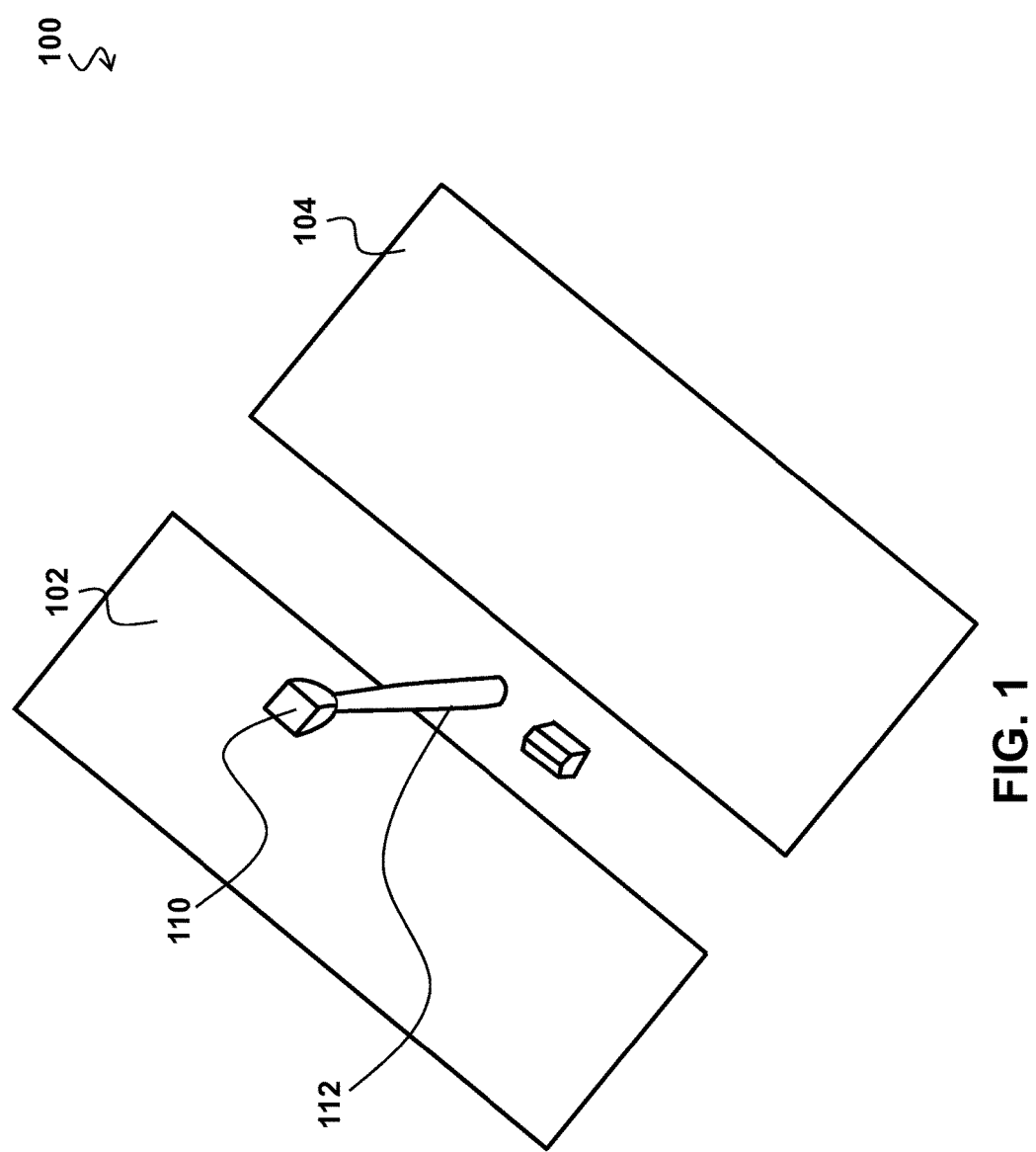
FIG. 1 depicts a perspective view of an exemplary solar thermal receiver positioned between two heliostat arrays.

FIG. 1 depicts a perspective view of an exemplary solar thermal receiver 110 positioned between two heliostat arrays 102,104 in a solar power plant system 100. The central receiver 110 may be positioned between a first heliostat array 102 and a second heliostat array 104. An exemplary solar plant may comprise one or more central receivers 110, with one or more corresponding heliostat arrays 102,104 reflecting incident Sunlight to a corresponding central receiver 110 that may be mounted on a tower 112.

Figure 2A:
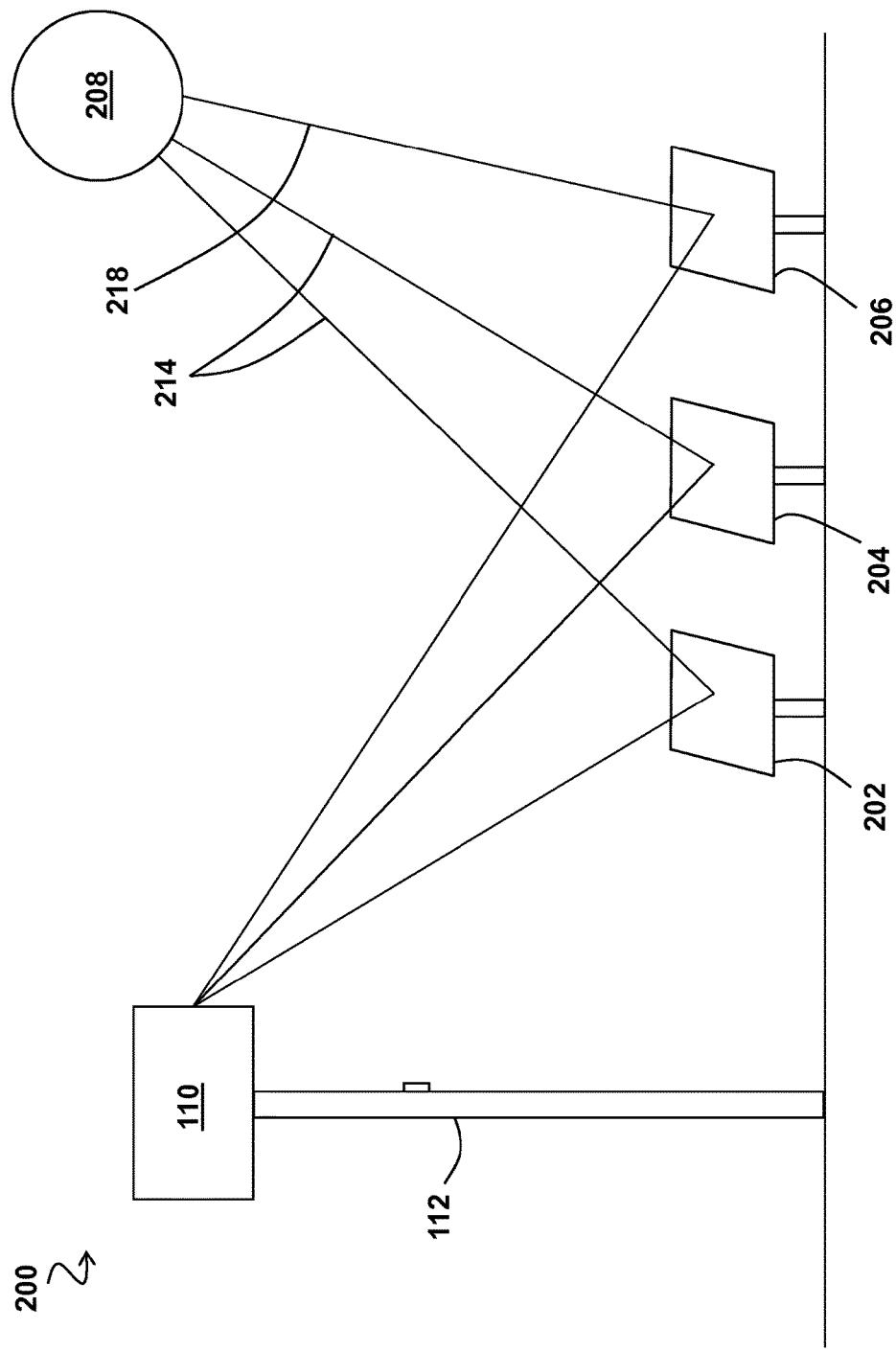
FIG. 2A depicts an exemplary central receiver solar plant with a central receiver receiving flux from all three heliostats.

FIG. 2A depicts an exemplary central receiver solar plant system 200 with a central receiver 110 receiving flux 214, 218 from three exemplary heliostats 202,204,206 depicted as receiving Sunlight. The plant may comprise one or more ground-mounted heliostats 202,204,206. The one or more ground mounted heliostats 202,204,206 may be grouped into one or more heliostat arrays (see FIG. 1). An exemplary array of heliostats may comprise a plurality of heliostats arranged in a specific order and/or in a predetermined arrangement. A systematic arrangement of heliostats, for example, in rows and columns, may vary in the number of heliostats it comprises. The central receiver 110 may be mounted on a tower 112 at an elevated position relative to a local level, such that the ground mounted heliostats 202, 204,206 may have a clear field of view to reflect flux 214,218 toward the central receiver 110. In some embodiments, as the Sun 208 moves throughout the day, the heliostats 202,204,206 may track the movement of the Sun 208 in order to continue directing flux at the central receiver 100 or some other aim point. In the exemplary embodiment depicted in FIG. 2A, the flux 214,218 from the Sun 208 is directed at the central receiver 110 by all three of the heliostats 202,204,206.

Figure 2B:
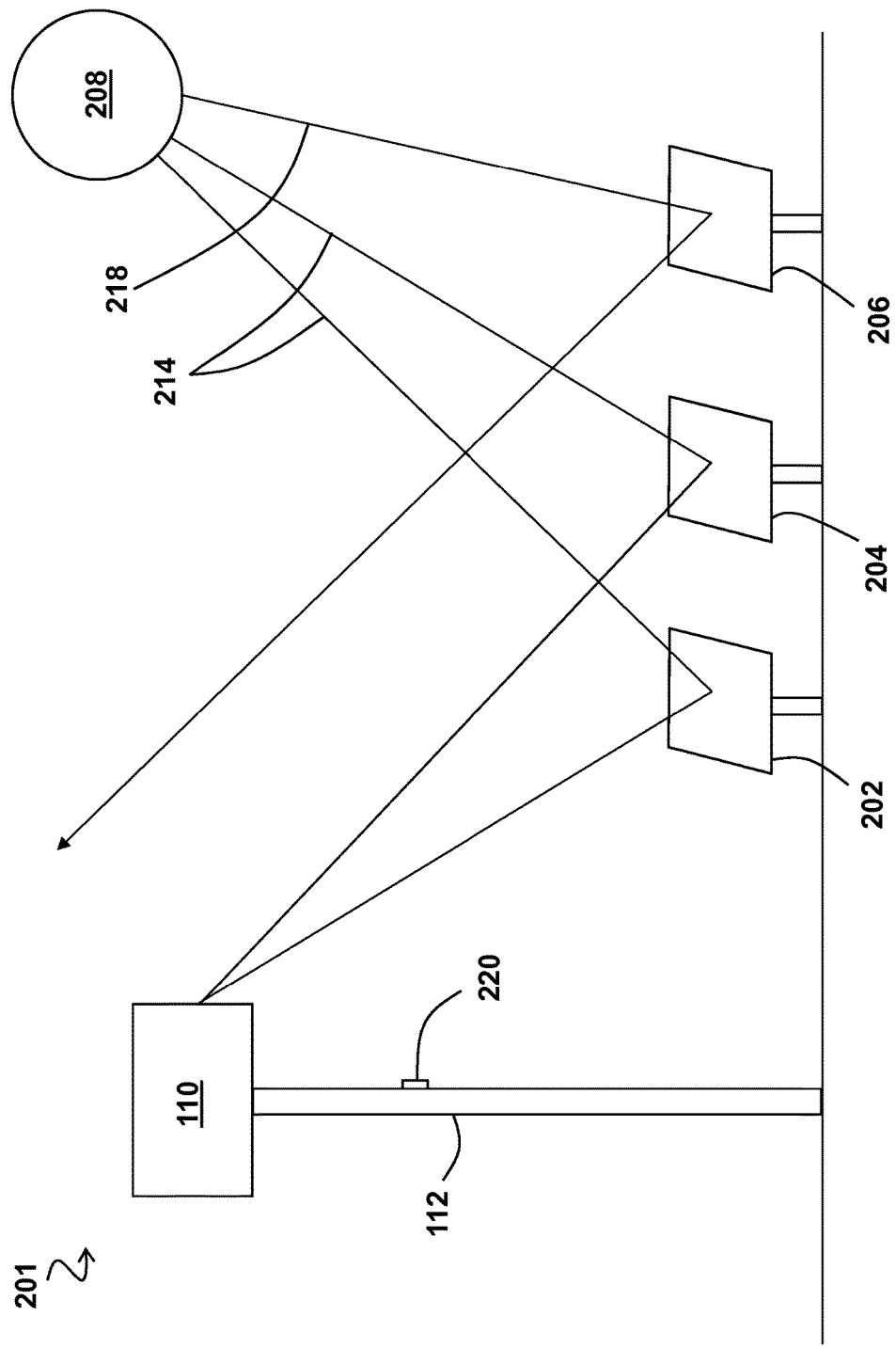
FIG. 2B depicts an exemplary central receiver solar plant with a central receiver receiving flux from two out of three heliostats.

FIG. 2B depicts an exemplary central receiver solar plant system 201 with a central receiver receiving flux 214 from two heliostats 202,204 out of the three heliostats 202,204, 206 depicted as receiving Sunlight. There may be times when some of the flux 214,218 on the central receiver 110 must be removed, or added, by moving the position of one or more heliostats 202,204,206. This may be due to varying flux requirements throughout the day and/or limits on the amount of flux that the central receiver 110 can absorb in steady state with no circulation, e.g., when a source of receiver feedwater is lost. This flux limit for the central receiver 110 may vary based on the design and/or construction of the receiver. If the central receiver 110 requires less flux, one or more heliostats 206 may change position to reflect flux 218 away from the central receiver 110 and to an alternate location. This alternate location should not put light on the central receiver 110 or associated equipment 220 mounted on the tower 112 or elsewhere. In some exemplary embodiments, the selection of this alternate location may be subject to several additional requirements.

FIG. 3 depicts an exemplary control processing unit 300 for determining one or more safe target points to reflect flux, for heliostats that are not reflecting flux onto a central receiver. The system may comprise one or more control processing units 314 having a processor 310 and memory 312 addressable with a data bus 316. The one or more processing units 314 may be used to compute a zone of exclusion around a central receiver and/or associated equipment where a heliostat is not allowed to point. This zone of exclusion may be subject to different combinations of requirements, and determining a safe alternate location, or safe target point, may be based on this exclusion zone along with one or more other requirements. The control processing unit 314 may control a single heliostat or a group of heliostats. The control processing unit 314 may be configured to generate individual and/or group-wise optimal orientation commands to one or more heliostat servos of the one or more heliostat arrays in order to effect a change in the position of the one or more heliostats.

Figure 4:
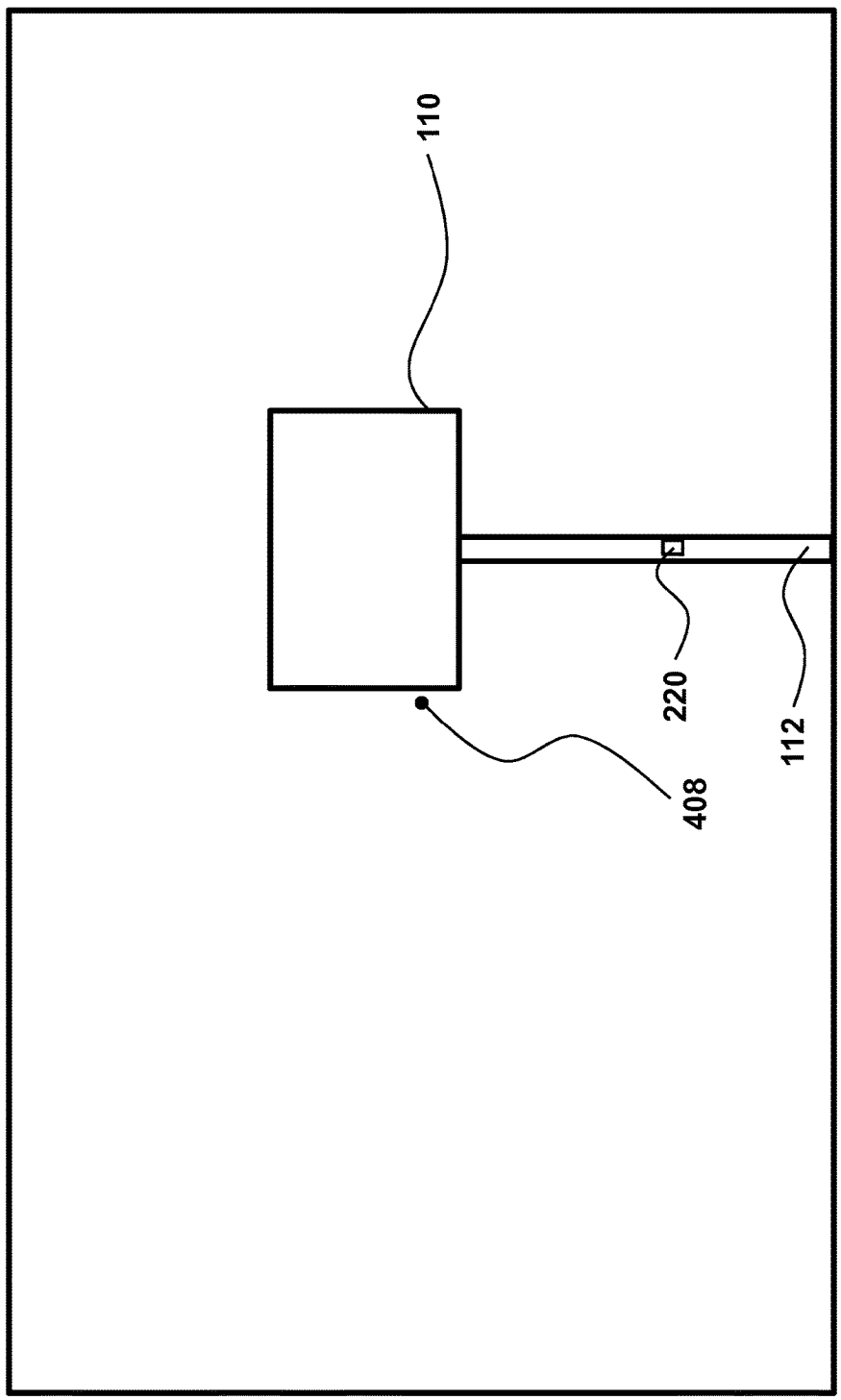
FIG. 4 depicts an exemplary central receiver, tower, and associated equipment as seen from a heliostat.

FIG. 4 depicts an exemplary central receiver 110, tower 112, and associated equipment 220 as seen from a heliostat mounted on a local level. The central receiver 110 may be mounted atop a tower 112 at a distance from the heliostat. The central receiver 110 and/or tower 112 may comprise one or more pieces of associated equipment 220, e.g., a reflectivity measurement system. The heliostat aim point 408 may represent the current position to which the heliostat is reflecting Sunlight.

Figure 5:
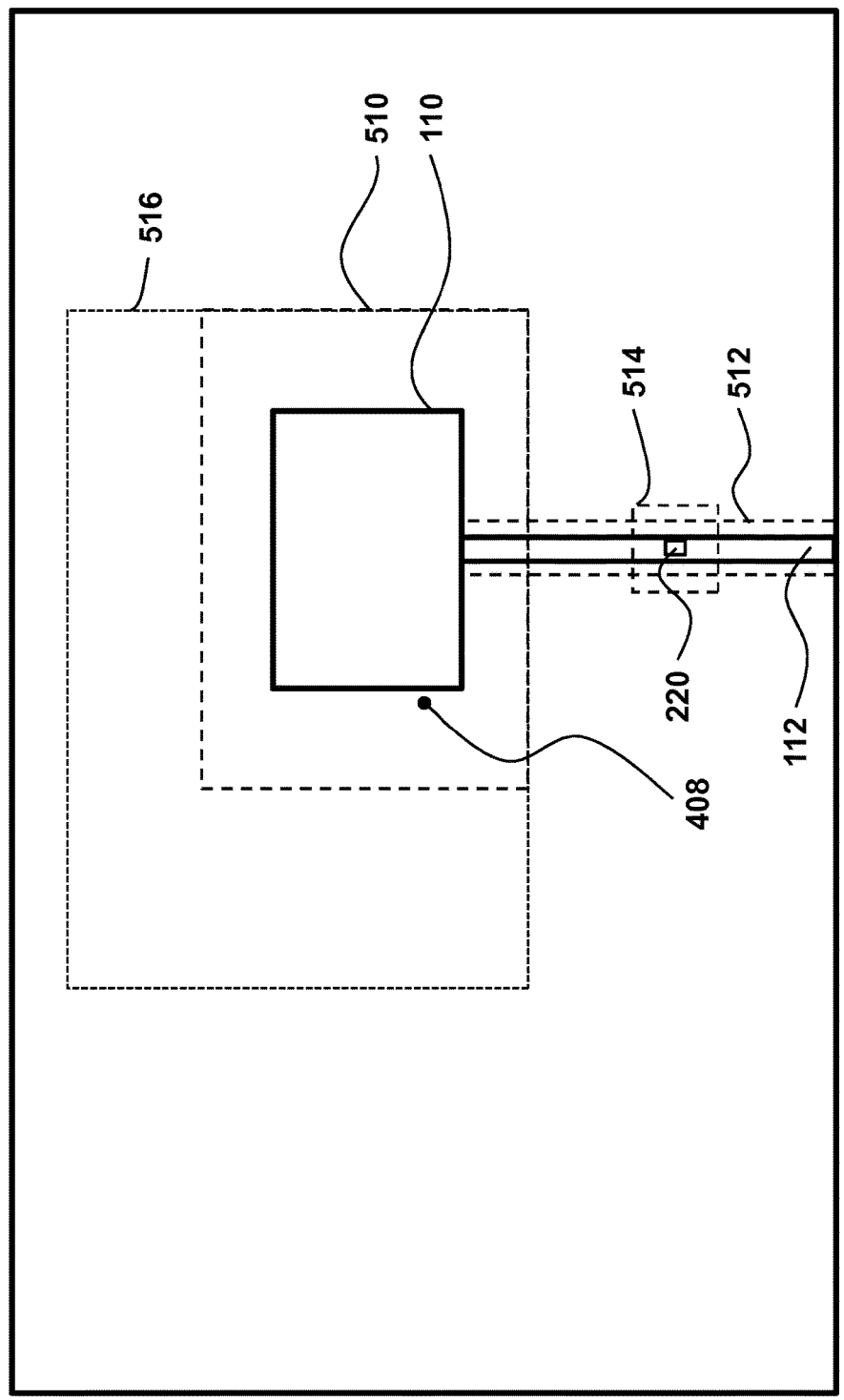
FIG. 5 depicts an exemplary central receiver, tower, and associated equipment as seen from a heliostat with safety margins added.

FIG. 5 depicts an exemplary central receiver 110, tower 112, and associated equipment 220 as seen from a heliostat mounted on a local level with safety margins 510,512,514 added. In an exemplary embodiment, the geometry of the central receiver 110, tower 112, and any associated equipment 220 may be projected onto a plane image as seen from the perspective of a heliostat, using a perspective transform. This plane may be at a distance significantly further from the heliostat than the distances between the heliostat's axes and the heliostat mirror center in order to mitigate any errors due to shifts in the heliostat perspective origin as the heliostat moves. From this image, an unsafe region 510,512,514 may be determined and added around the receiver 110, the tower 112, and any other associated equipment 220, respectively. The unsafe region 510,512,514 may be, at a minimum, the expected beam size from the heliostat. It may be unsafe, or undesirable, to point the heliostat, from whose perspective the plane image is created, at these unsafe regions 510,512, 514, particularly when this heliostat is not directed to reflect Sunlight onto the central receiver 110.

Depending on the constraints utilized, and the level of tolerance, these one or more unsafe regions 510,512,514 may be expanded. The dimensions of the expanded unsafe region 516, or additional disallowed target region, may be chosen to be safe based on and against any inaccuracy in the heliostat pointing. The dimensions of this expanded unsafe region 516 may be pre-set and/or later determined based on a trade-off between a desire to probabilistically allow no flux on the central receiver 110 and a desire to keep a safe target tracking position near the central receiver 110. Further, the dimensions of the expanded unsafe region 516 may change depending on the time of day, i.e., the position of the Sun, in order to adapt to changing constraints. In some exemplary embodiments, the expanded unsafe region 516 may exclude the areas in which a heliostat may drift back into the unsafe regions 510,512,514. This may be useful in embodiments where heliostats stop moving once they have reached a designated safe position. This may also be useful if the solar power plant loses electrical power and the heliostat is not able to track the Sun for the remainder of the day, but the plant has enough backup power to position the heliostat into a safe target position. Optionally, in one embodiment, a convex hull of the plane image may be used in place of a full set of information. Additionally, an additional disallowed target region may be divided into convex polygons.

In one embodiment, the constraints may be based on a set of safe target points where the system may probabilistically deliver no flux to the central receiver, the tower, and the associated equipment, and where the safe target point may be a minimal distance from the central receiver. The safe target selection may further comprise constrains where the constraints may be at least one of a scenario where: the safe target point delivers probabilistically no flux to the central receiver, the tower, and the associated equipment; the safe target point is a minimal distance from the central receiver; the safe target point is within the tracking range of motion of the heliostat for the remainder of the day; the movement required to keep a heliostat tracking at a safe target point for the remainder of the day does not exceed a set limit; the safe target point will not drift back into the unsafe region in the event of a power failure that prevents the heliostat from tracking the safe target point; the safe target point does not create an overly-high flux concentration when combined with the safe target points of other heliostats; and the safe target point does not necessitate moving the heliostat across an unsafe region.

In one embodiment, the unsafe regions 510,512,514 for a heliostat may be defined as the set of all points for which pointing at that heliostat may result in light being cast onto sensitive components. This may be determined by the method of dilating the geometry of the equipment to an area neighboring the equipment in order to provide a margin of beam size and pointing error. The Sun drift expanded unsafe region 516, for a given time, may be the set of all positions for which, if the heliostats were oriented to point anywhere in this region and remained stationary in that orientation, the heliostats would end up pointing at a position from the unsafe region at some time in the future—within a given look-ahead limit. The Sun drift expanded unsafe region may be a strict superset of the unsafe region. Accordingly, the heliostat exclusion zone may be the union of the set of positions in the Sun drift expanded unsafe region 516 with the set of positions to which the heliostat is unable to point due to range of motion of the heliostat, or lack thereof.

Figure 6:
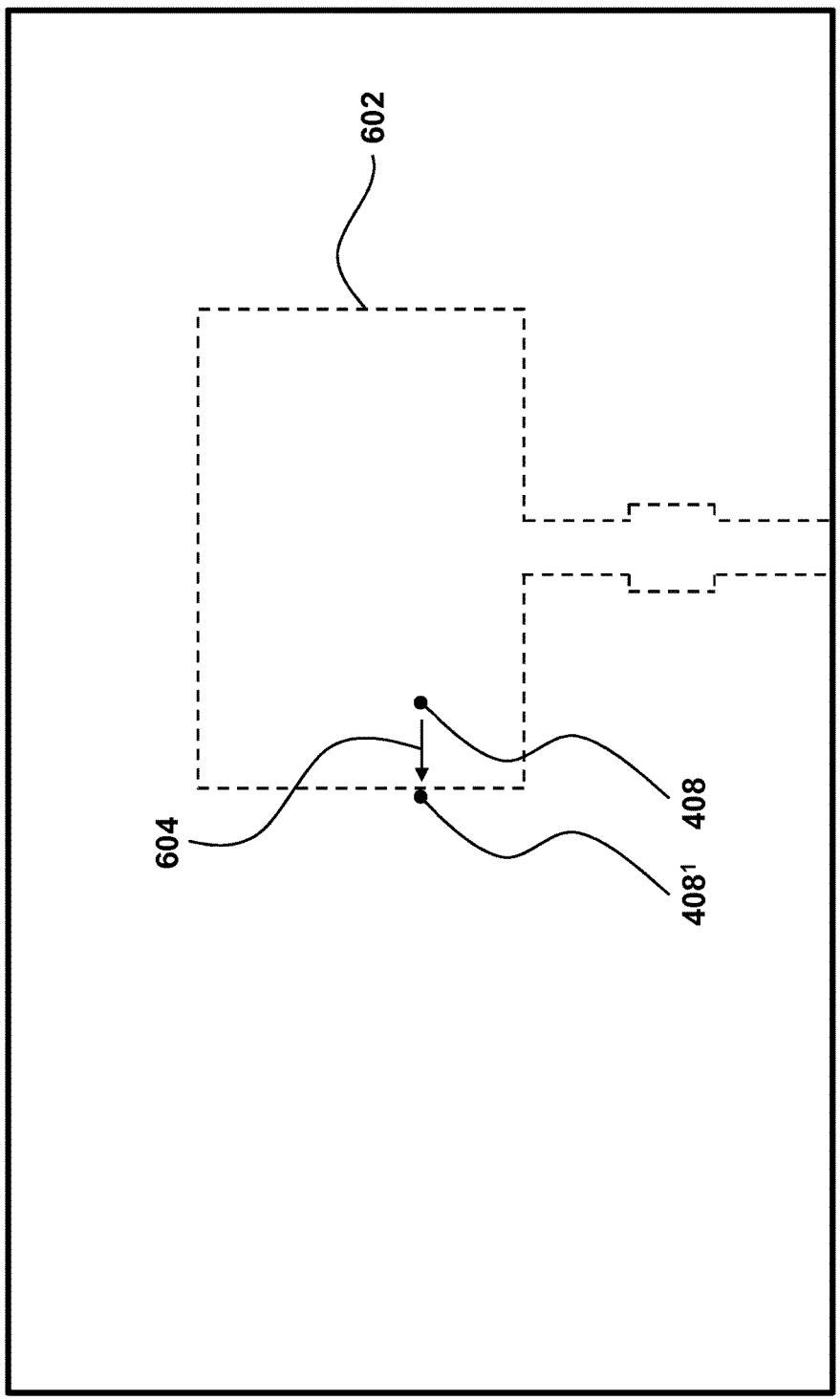
FIG. 6 depicts an exemplary selection of a safe target given the unsafe region.

FIG. 6 depicts an exemplary selection of a safe target $408^1$ given the unsafe region 602. Once the unsafe region 602 has been determined, and based on a combination of the unsafe regions 510,512,514 of FIG. 5, the tracking aim point 408 may be projected onto a plane image. From this starting position, a direction of travel 604 is determined and the heliostat may reposition to move the aim point 408 a minimum distance required to exit the unsafe region 602. The resulting point may be chosen as the safe target $408^1$. The direction of travel 604 may be chosen by one of several methods. In the absence of other constraints, the direction of motion 604 may be chosen to be the one that minimizes the distance to the edge of the unsafe region 602 from the aim point 408. In some embodiments, certain directions of travel may be excluded in order to protect restricted areas, such as an uncooled appurtenance of the receiver, e.g., the associated equipment 220 of FIGS. 4-5. In other embodiments, some directions of travel may be excluded due to limits on the range of motion of the heliostat. If this limit is applicable, an additional constraint may be added to pick a direction that is a minimum distance away from the previous safe direction in order to improve target stability.

In one embodiment, the direction of travel 604 may be selected from a set of directions where the set of directions may be a limited set based on a defined rule set. This limited set of directions may assist in defocusing the resulting flux if two or more heliostats are tracking their selected safe targets. The choice of direction of travel from within the limited set may include a random, quasi-random, or round-robin selection. The change of direction of travel may also choose the direction to the nearest edge of the unsafe region 602. In some embodiments, the direction may be chosen by a quasi-random selection technique and based on an ergodic function on the heliostat position relative to the receiver. That is, an ergodic function may include or relate to the probability that any state may reoccur; especially having zero probability that any state may never reoccur. For the ergodic function to choose the heliostat direction, the processor may select any function for which the following are true: (i) the direction chosen for a given heliostat will always be the same; (ii) the distribution of choices for any random subset of heliostats will be indistinguishable from a random selection of directions; and (iii) if there is a deterministic priority ordering for which heliostats are aimed to their standby targets first, when only a subset are aimed to standby, then within discretization error all subsets of heliostats chosen by that ordering must have their directions distributed in the same proportions as the distribution for the whole population. Requirement (iii) may in some embodiments be stronger, or have a larger weight, than the requirement (ii). An exemplary function to satisfy these requirements may depend on the picking order for a standby position as used in requirement iii. A function of the heliostat position with a period that is shorter than the heliostat spacing, and which is not a multiple of any heliostat spacing with any rational number, may suffice.

In one exemplary embodiment, determining the selection of a safe target may be based on one or more constraints where it may be desirable to determine one or more safe targets to which each heliostat may point without violating the set of one or more constraints. One constraint may be to deliver no flux to the central receiver 110, tower 112, or associated equipment 220 (See FIGS. 4-5). This requirement may be loosened to probabilistically allow small amounts of flux. Another constraint may be to keep the safe target $408^1$ as near to the central receiver 110 (See FIGS. 4-6) as possible. This may allow the heliostat to be quickly moved from the safe target $408^1$ to the central receiver 110 (See FIGS. 4-6), and back again, depending on the flux requirements of the solar power plant. Another constraint may be to keep the motion required to reposition the heliostat to the safe target $408^1$ within the associated available range of motion of the heliostat. Another constraint may be to select a safe target $408^1$ that does not move quickly as the day progresses. Another constraint may be to select a safe target $408^1$ such that a power failure preventing the heliostat from tracking the selected safe target $408^1$ does not cause the heliostat aim point to drift back into the unsafe region 602 as the Sun moves throughout the day. Another constraint may be to defocus the flux such that if every heliostat were tracking in their safe position, there would be no areas in free space with overly-high flux concentrations, that is, the system may continuously monitor and verify that a specified or predetermined flux threshold has not been reach at the determined aim point. This defocusing approach may ensure that birds, and other wildlife, are not disoriented or otherwise harmed by the reflected Sunlight off of the heliostats tracking in their safe positions. Another constraint may be to restrict certain paths off of the receiver. This restriction may be due to the design of the receiver and/or the presence of sensitive instrumentation. These constraints may be strict or flexible based on the solar plant set-up, tolerances, and/or local laws. Application of these constraints may be based on which factors are used to compute the unsafe region 602, and which direction-choosing algorithm is chosen.

Figure 7:
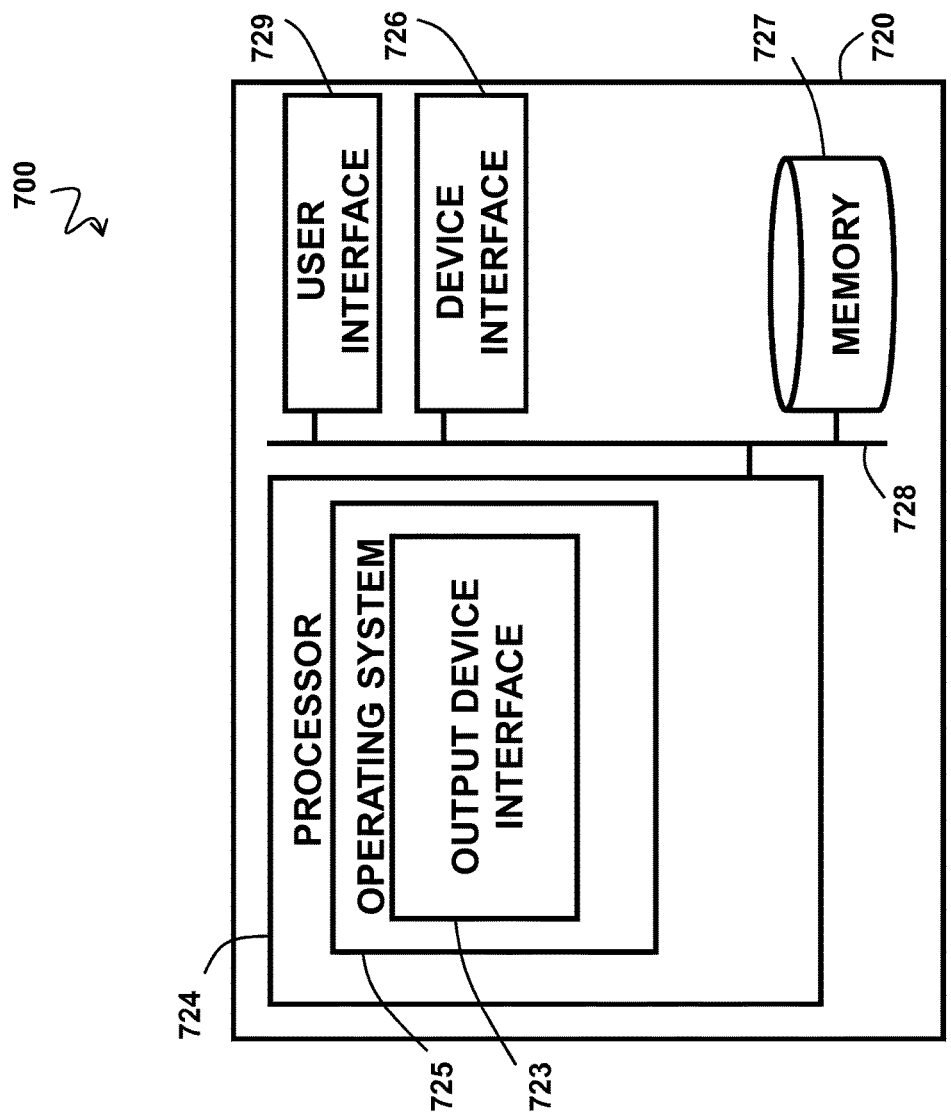
FIG. 7 illustrates an exemplary top level functional block diagram of a safe target position computing system embodiment.

FIG. 7 illustrates an exemplary top level functional block diagram of a safe target position computing system embodiment 700 comprising a plurality of heliostats near a concentrating solar power receiver. The exemplary operating environment is shown as a computing device 720 comprising a processor 724, such as a central processing unit (CPU); an addressable memory 727, such as a lookup table having an array; an external device interface 726, such as an optional universal serial bus port and related processing, and/or an Ethernet port and related processing; an output device interface 723; and an optional user interface 729, such as an array of status lights, and/or one or more toggle switches, and/or a display, and/or a keyboard and/or a pointer-mouse system and/or a touch screen. A user interface 729 may also have at least one user interface element. Examples of user interface elements comprise: input devices including manual input such as buttons, dials, keyboards, touch pads, touch screens, mouse and wheel related devices, and voice and line-of-sight interpreters. Additional examples of user interface elements comprise output devices including displays, tactile feedback devices, and auditory devices. Optionally, the addressable memory may, for example, be: flash memory, SSD, EPROM, and/or a disk drive and/or another storage medium. These elements may be in communication with one another via a data bus 728. An operating system 725, such as one supporting the execution of applications, may comprise a processor 724 which may be configured to execute steps of computing a safe target position for heliostats near a concentrating solar power receiver.

Figure 8:
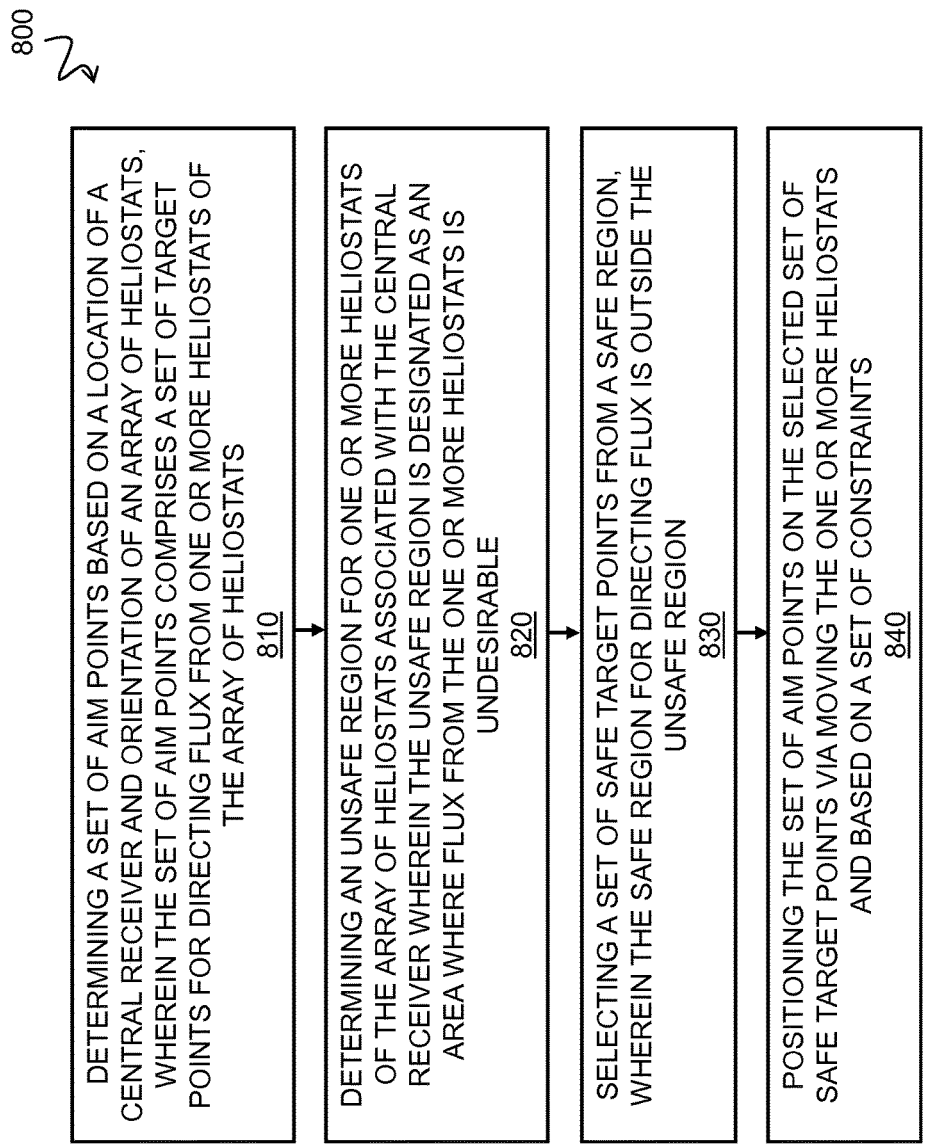
FIG. 8 depicts, in a top-level flowchart, an exemplary method of implementation of a safe target position computing system.

Embodiments may include an exemplary method of implementation of a safe target position computing system 800 for heliostats near a concentrating solar power receiver, as illustrated in a top-level flowchart of FIG. 8. The exemplary steps of the system, and associated computing devices, may comprise the following steps: (a) determining a set of aim points based on a location of a central receiver and orientation of an array of heliostats, wherein the set of aim points comprises a set of target points for directing flux from one or more heliostats of the array of heliostats (step 810); (b) determining an unsafe region for one or more heliostats of the array of heliostats associated with the central receiver wherein the unsafe region is designated as an area where flux from the one or more heliostats is undesirable (step 820); (c) selecting a set of safe target points from a safe region, wherein the safe region for directing flux is outside the unsafe region (step 830); and (d) positioning the set of aim points on the selected set of safe target points via moving the one or more heliostats and based on a set of constraints (step 840).

It is contemplated that various combinations and/or subcombinations of the specific features and aspects of the above embodiments may be made and still fall within the scope of the invention. Accordingly, it should be understood that various features and aspects of the disclosed embodiments may be combined with or substituted for one another in order to form varying modes of the disclosed invention. Further it is intended that the scope of the present invention herein disclosed by way of examples should not be limited by the particular disclosed embodiments described above.

What is claimed is:

1. A method comprising:
   determining, by a processor having an addressable memory, a set of aim points for heliostats that are not reflecting flux onto a central receiver, the determining based on a location of a central receiver and orientation of an array of heliostats, wherein the set of aim points comprises a set of target points for directing flux from one or more heliostats of the array of heliostats;
   determining, by the processor, an unsafe region for the one or more heliostats of the array of heliostats associated with the central receiver, wherein the unsafe region is designated as an area comprising the geometry of the central receiver dilated by at least the radius of an expected beam size generated from a heliostat, where flux from the one or more heliostats is undesirable;
   selecting, by the processor, a set of safe target points from a safe region based on a set of constraints, wherein the safe region is outside the unsafe region, does not comprise the central receiver, and is as near to the central receiver as possible; and
   positioning, by the processor, the determined set of aim points on the selected set of safe target points via moving the one or more heliostats.

2. The method of claim 1, wherein positioning the set of aim points on the selected set of safe target points via moving the one or more heliostats is in one or more direction that is based on one or more minimum distance required to exit the determined unsafe region.

3. The method of claim 2, wherein the direction chosen for a given heliostat is based on an ergodic function for which the following are true: the direction chosen for a given heliostat will always be the same, the distribution of direction choices for any random subset of heliostats will be indistinguishable from a random set of directions, and any directions for a subset of heliostats must be distributed in the same proportions as the distribution of directions for all heliostats.

4. The method of claim 1, wherein a constraint of the set of constraints is a limit on a range of motion of the one or more heliostats.

5. The method of claim 1, wherein the unsafe region is designated as an area neighboring the location of the central receiver, wherein the unsafe region is a set of all positions for which, if the one or more heliostats were oriented to point anywhere in this unsafe region and remained stationary in that orientation, the one or more heliostats would end up pointing at a position from the unsafe region at some time in the future.

6. The method of claim 1, further comprising:
   projecting a geometry of the central receiver, tower, and associated equipment onto a plane image using a perspective transform as seen from a perspective of a heliostat;
   dilating the geometry of the central receiver, tower, and associated equipment in the plane image by a safety margin, wherein the safe region is outside the dilated safety margin.

7. The method of claim 6 further comprising:
adding an additional disallowed target region to the safety margin.

8. The method of claim 7, wherein the additional disallowed target region changes in size over the course of a day due to at least one of: position of Sun and changing constraints imposed by a range of motion of the heliostat.

9. The method of claim 7, wherein the additional disallowed target region accounts for tolerances of aiming accuracy of the one or more heliostats.

10. The method of claim 7, wherein the additional disallowed target region comprises areas within which an aim point of the set of aim points for a non-tracking heliostat of the one or more heliostats would drift into the unsafe region over a course of a day.

11. The method of claim 7, wherein the additional disallowed target region is divided into convex polygons.

12. The method of claim 1, wherein the determined unsafe region comprises the geometry of the central receiver dilated by at least a radius of an expected beam size generated from a heliostat of the one or more heliostats.

13. A method comprising:
projecting, by a processor having an addressable memory, a heliostat aim point onto a plane image comprising a central receiver, a tower, and associated equipment;
determining, by the processor, an unsafe region of the plane image, wherein the unsafe region is designated as an area comprising the geometry of the central receiver dilated by at least the radius of an expected beam size generated from a heliostat where flux from the heliostat is undesirable;
selecting, by the processor, a direction of travel for the projected aim point based on the determined unsafe region and subject to one or more constraints; and
determining, by the processor, a safe target point by moving the heliostat aim point in the selected direction of travel to exit the unsafe region, wherein the safe target point delivers no flux to the central receiver, the tower, and the associated equipment and is as close to the central receiver as possible.

14. The method of claim 13, wherein the selected direction of travel minimizes a distance from the projected heliostat aim point to an edge of the unsafe region.

15. The method of claim 13, wherein one of the one or more constraints is that a direction is excluded if movement in that direction causes the heliostat aim point to move over a restricted area and the restricted area is at least one of: an uncooled appurtenance of a central receiver and an associated equipment.

16. The method of claim 13, wherein one of the one or more constraints is that a direction is excluded if the heliostat is unable to track the safe target point on the edge of the unsafe region throughout the remainder of the day without going beyond the range of motion of the heliostat.

17. The method of claim 13, wherein one of the one or more constraints is that if the minimal distance from the projected heliostat aim point to an edge of the unsafe region is excluded, one or more additional constraints are used to select the direction of travel.

18. The method of claim 13, wherein one of the one or more constraints is to continuously verify that the determined safe target point does not exceed a flux concentration based on a flux threshold when combined with one or more additional heliostat safe target points.

19. The method of claim 13, wherein selecting the direction of travel is based on a strategy to defocus resulting flux off of the receiver by at least one of: a random selection, a quasi-random selection, and a round-robin selection.

20. A safe target selection system comprising:
a control processing unit comprising a processor and an addressable memory; the processor configured to:
project a heliostat aim point onto a plane image comprising: a central receiver, a tower, and an associated equipment;
determine an unsafe region around at least one: the central receiver, the tower, and the associated equipment; and
select a set of safe target points for the heliostat, wherein the set of safe target points are outside the unsafe region and satisfy one or more constraints; and
determine a safe target point by movement of the heliostat aim point in the selected direction of travel to exit the unsafe region, wherein the safe target point delivers no flux to the central receiver, the tower, and the associated equipment and is as close to the central receiver as possible.

* * * * *